US011664183B2

United States Patent
Wright et al.

(10) Patent No.: US 11,664,183 B2
(45) Date of Patent: May 30, 2023

(54) EXTENDED CATHODE AND REPELLER LIFE BY ACTIVE MANAGEMENT OF HALOGEN CYCLE

(71) Applicant: Applied Materials, Inc., Santa Clara, CA (US)

(72) Inventors: Graham Wright, Newburyport, MA (US); Daniel Alvarado, Methuen, MA (US); Eric Donald Wilson, Rockport, MA (US); Robert Lindberg, Rockport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 258 days.

(21) Appl. No.: 17/308,732

(22) Filed: May 5, 2021

(65) Prior Publication Data
US 2022/0359147 A1 Nov. 10, 2022

(51) Int. Cl.
| H01J 37/08 | (2006.01) |
| H01J 27/08 | (2006.01) |
| H01J 27/02 | (2006.01) |
| H01J 37/30 | (2006.01) |

(52) U.S. Cl.
CPC ............ *H01J 27/08* (2013.01); *H01J 27/022* (2013.01); *H01J 37/08* (2013.01); *H01J 37/3002* (2013.01)

(58) Field of Classification Search
CPC .......... H01J 27/08; H01J 27/022; H01J 37/08; H01J 37/3002
See application file for complete search history.

(56) References Cited

U.S. PATENT DOCUMENTS

| 8,756,021 B2 | 6/2014 | Low et al. |
| 2004/0066128 A1 | 4/2004 | Suguro |
| 2007/0210260 A1 | 9/2007 | Horsky et al. |
| 2010/0320395 A1 | 12/2010 | Hahto et al. |
| 2015/0179385 A1 | 6/2015 | Sato |

(Continued)

FOREIGN PATENT DOCUMENTS

| JP | 2016-91795 A | 5/2016 |
| TW | 200523977 A | 7/2005 |
| TW | 201438052 A | 10/2014 |

(Continued)

OTHER PUBLICATIONS

International Search Report and Written Opinion dated Jul. 28, 2022 in corresponding PCT application No. PCT/US2022/024407.

*Primary Examiner* — Henry Luong
(74) *Attorney, Agent, or Firm* — Nields, Lemack & Frame, LLC (57) ABSTRACT

A system and method for extending the life of a cathode and repeller in an IHC ion source is disclosed. The system monitors the health of the cathode by operating using a known set of parameters and measuring the bias power used to generate the desired extracted beam current or the desired current from the arc voltage power supply. Based on the measured bias power, the system may determine whether the cathode is becoming too thin, and may take a corrective action. This corrective action may be to alert the operator; to operate the IHC ion source using a predetermined set of parameters; or to change the dilution used within the IHC source. By performing these actions, the life of the cathode may be more than doubled.

20 Claims, 5 Drawing Sheets

(56) References Cited

U.S. PATENT DOCUMENTS

2019/0066967 A1    2/2019  Kao et al.
2019/0122851 A1*   4/2019  Tieger .................... H01J 37/08

FOREIGN PATENT DOCUMENTS

| TW | 201810338 A   | 3/2018 |
| WO | 2010/093380 A1 | 8/2010 |
| WO | 2021/050206 A1 | 3/2021 |

* cited by examiner

EXTENDED CATHODE AND REPELLER LIFE BY ACTIVE MANAGEMENT OF HALOGEN CYCLE

This disclosure describes systems and methods for extending cathode and repeller life in an ion source, and more particularly, actively managing the halogen cycle to extend the life of these components.

BACKGROUND

Semiconductor devices are fabricated using a plurality of processes, some of which implant ions into the workpiece. One mechanism that may be used to create the ions is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the end of the chamber opposite the cathode.

In certain embodiments, the ion source is configured to generate singly-charged ions. In other embodiments, the ion source is configured to generate multi-charged ions, such as $P^{2+}$ or $P^{3+}$. It has been found that the generation of multi-charged ions may contribute to the erosion and eventual puncturing of the cathode. Specifically, the charged ions accelerate towards the cathode, causing the cathode to sputter. A similar phenomenon may also occur with respect to the repeller. Consequently, cathode and repeller life may be the limiting factor in source life for configurations that generates multi-charged ions.

Therefore, it would be beneficial if there was a system and method that could extend the life of the cathode. Further, it would be advantageous if this system and method did not utilize any new or redesigned components and could be readily adopted for existing IHC ion sources.

SUMMARY

A system and method for extending the life of a cathode and repeller in an IHC ion source is disclosed. The system monitors the health of the cathode by operating using a known set of parameters and measuring the bias power used to generate the desired extracted current or the desired current from the arc voltage power supply. Based on the measured bias power, the system may determine whether the cathode is becoming too thin, and may take a corrective action. This corrective action may be to alert the operator; to operate the IHC ion source using a predetermined set of parameters; or to change the dilution used within the IHC source. By performing these actions, the life of the cathode may be more than doubled.

According to one embodiment, an ion source is disclosed. The ion source comprises a chamber comprising a plurality of walls; a cathode disposed on one end of the chamber; a gas inlet to allow the introduction of one or more gasses into the chamber; and a controller, wherein the controller operates the ion source using a known recipe and adjusts a first parameter of the ion source to maintain a second parameter at a predetermined value, wherein a value of the first parameter is indicative of a thickness of the cathode; and wherein the controller initiates an action based on the thickness. In certain embodiments, the second parameter comprises a total extracted current from the chamber. In some embodiments, the ion source comprises an arc voltage power supply to bias the cathode relative to the chamber and the second parameter comprises a current drawn from the arc voltage power supply. In certain embodiments, the first parameter comprises bias power. In some embodiments, the first parameter is selected from the group consisting of bias current, bias voltage, bias impedance, filament power, filament current, filament voltage, and filament resistance. In certain embodiments, the action comprises an alert to an operator. In some embodiments, the action comprises operating the ion source with a specific recipe. In some embodiments, if the thickness of the cathode is determined to be less than a predetermined thickness, the specific recipe comprises a low arc voltage recipe. In certain embodiments, the low arc voltage recipe is operated without dilution. In some embodiments, if the thickness of the cathode is determined to be more than a predetermined thickness, the specific recipe comprises a high arc voltage recipe. In certain embodiments, the action comprises adjusting a flow rate of dilution gas into the chamber. In some embodiments, if the thickness of the cathode is determined to be less than a predetermined thickness, the flow rate of dilution gas is decreased. In some embodiments, if the thickness of the cathode is determined to be more than a predetermined thickness, the flow rate of dilution gas is increased.

According to another embodiment, a method of monitoring and extending a life of a cathode in an indirectly heated cathode (IHC) ion source is disclosed. The method comprises operating the IHC ion source using a known recipe; monitoring a first parameter used to maintain a second parameter at a predetermined value, wherein a value of the first parameter is indicative of a thickness of the cathode; comparing the first parameter to predetermined upper and lower limits; and performing an action based on the comparison. In certain embodiments, the second parameter comprises a total extracted current from the IHC ion source. In some embodiments, the IHC ion source comprises an arc voltage power supply to bias the cathode relative to a chamber of the IHC ion source and the second parameter comprises a current drawn from the arc voltage power supply. In certain embodiments, the first parameter comprises bias power. In some embodiments, the first parameter is selected from the group consisting of bias current, bias voltage, bias impedance, filament power, filament current, filament voltage, and filament resistance. In certain embodiments, the action comprises alerting an operator. In some embodiments, the action comprises operating the ion source with a specific recipe. In some embodiments, if the thickness of the cathode is determined to be less than a predetermined thickness, the specific recipe comprises a low arc voltage recipe. In certain embodiments, the low arc voltage recipe is operated without dilution. In some embodiments, if the thickness of the cathode is determined to be more than a predetermined thickness, the specific recipe comprises a high arc voltage recipe. In certain embodiments, the action comprises adjusting a flow rate of dilution gas into the chamber. In some embodiments, if the thickness of the cathode is determined to be less than a predetermined thickness, the flow rate of dilution gas is decreased. In some embodiments, if the thickness of the cathode is determined to be more than a predetermined thickness, the flow rate of dilution gas is increased.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
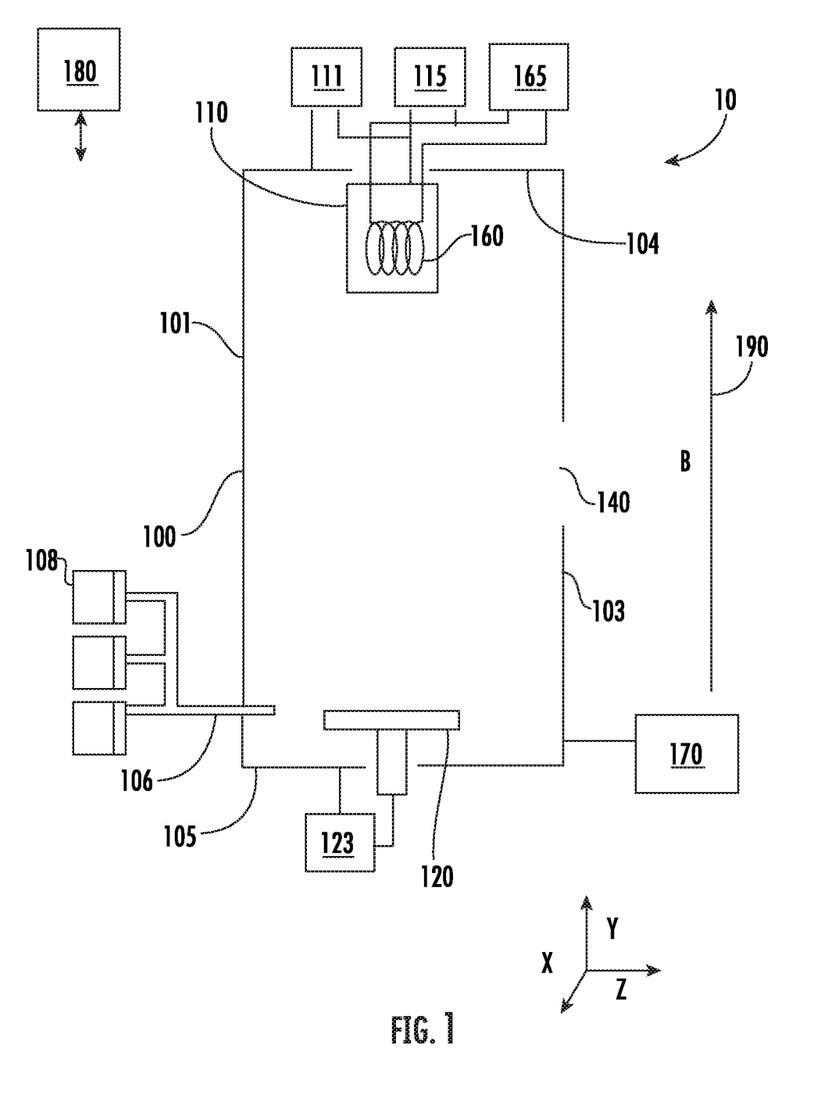
FIG. 1 is a block diagram showing an IHC ion source according to one embodiment.

FIG. 1 shows an IHC ion source 10 that overcomes these issues. The IHC ion source 10 includes a chamber 100, comprising two opposite ends, and walls 101 connecting to these ends. These walls 101 include side walls, an extraction plate 103 and a bottom wall opposite the extraction plate 103. The extraction plate 103 includes an extraction aperture 140 through which ions are extracted. The walls 101 of the chamber 100 may be constructed of an electrically conductive material and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into arc chamber to ionize the neutral gas. The current drawn by this arc voltage power supply 111 is a measurement of the amount of current being driven through the plasma. In certain embodiments, the walls 101 provide the ground reference for the other power supplies.

In this embodiment, a repeller 120 is disposed in the chamber 100 on the second end 105 of the chamber 100 opposite the cathode 110. The repeller 120 may be in electrical communication with a repeller power supply 123. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 123 or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the y direction). Thus, electrons do not experience electromagnetic force to move in the y direction. However, movement of the electrons in other directions may experience an electromagnetic force.

One or more gas containers 108 may be in communication with the chamber 100 via a gas inlet 106. Each gas container 108 may include a mass flow controller (MFC) so as to regulate a flow of gas from each gas container.

An extraction power supply 170 may be used to bias the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

A controller 180 may be in communication with one or more of the power supplies such that the voltage or current supplied by these power supplies may be monitored and/or modified. Additionally, the controller 180 may be in communication with the MFCs of each gas container 108 so as to regulate a flow of each gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 2:
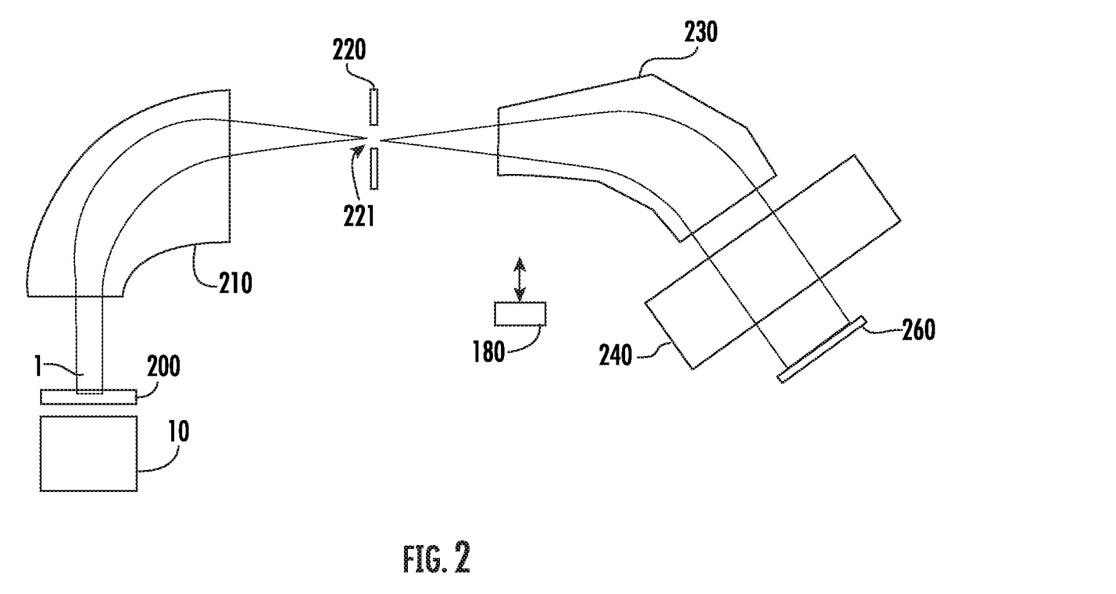
FIG. 2 is a block of an ion implantation system that uses the IHC ion source of FIG. 1.

FIG. 2 shows an ion implantation system using the IHC ion source 10 of FIG. 1. Disposed outside and proximate the extraction aperture of the IHC ion source 10 are one or more electrodes 200.

Located downstream from the electrodes 200 is a mass analyzer 210. The mass analyzer 210 uses magnetic fields to guide the path of the extracted ions 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

A certain set of operating parameters, also referred to as a recipe, may be utilized to generate ions of a desired charge. For example, a recipe that includes a lower arc voltage may create a first distribution of charged ions that produces a low rate of cathode erosion, or even in some instances, cathode growth. In one embodiment, the arc voltage is 80V or less for such a recipe. This may be referred to as a low arc voltage recipe. A recipe that includes a higher arc voltage may be used to create a second distribution of charged ions that produces a high rate of cathode erosion. For example, in one embodiment, the arc voltage may be greater than 80V. This may be referred to as a high arc voltage recipe. In certain embodiments, one difference between the first distribution and the second distribution may be the percentage of multi-charged ions.

Thus, in certain embodiments, a high arc voltage recipe may be defined as a recipe that utilizes an arc voltage above a predetermined threshold, while a low arc voltage recipe utilizes an arc voltage below this predetermined threshold. In certain embodiments, this predetermined voltage may be 80V but the specific threshold may depend on the types of species and recipes that are being executed on the IHC ion source.

Some high arc voltage recipes, which may be used to create multi-charged ions, utilize a halogen-based gas. For example, phosphorus may be implanted using $PF_3$. Nitrogen may be implanted using $NF_3$. Boron may be implanted using $BF_3$. Aluminum may be implanted by using elemental aluminum and $NF_3$. Gallium may be implanted using elemental gallium and $BF_3$. Antimony can be implanted using $SbF_5$. Of course, other species may be implanted using halogen-based gasses.

These high arc voltage recipes also may tend to sputter material from the cathode 110, causing the cathode 110 to become thinner over time. This is due to the fact that the ions collide with the cathode 110, causing it to sputter, and the higher the energy of the ions, as determined by the arc voltage and charge state, the greater the rate of sputtering. Left unchecked, this may eventually lead to cathode punch-through, where a hole is created completely through the cathode 110. Once this occurs, the cathode 110 is replaced, forcing the IHC ion source 10 to be inoperable for a period of time. In certain embodiments, this may occur after less than 100 hours of operation with recipes that generate multi-charged ions.

Additionally, low arc voltage recipes, especially those comprising a halogen, which may be used to create predominantly single charged ions, tend to remove tungsten from the walls of the IHC ion source 10 and deposit this tungsten on the cathode 110 and repeller 120. For example, the ionized fluorine may react with the walls of the ion source to form tungsten hexafluoride, which is then deposited on the cathode 110. To mitigate this, these recipes are often operated with dilution, such as through the introduction of hydrogen into the chamber 100. The hydrogen reacts with some of the ionized fluorine, reducing the interaction between the fluorine ions and the tungsten walls.

In other words, if a halogen-based high arc voltage recipe is used continuously, the cathode 110 will erode and eventually fail due to punch-through. Conversely, if a halogen-based low arc voltage recipe is used continuously without dilution, the cathode 110 will become thicker as more tungsten is deposited on it. At some point in time, the thickness of the cathode 110 becomes too thick to be adequately regulated by the cathode bias power supply 115.

Figure 3:
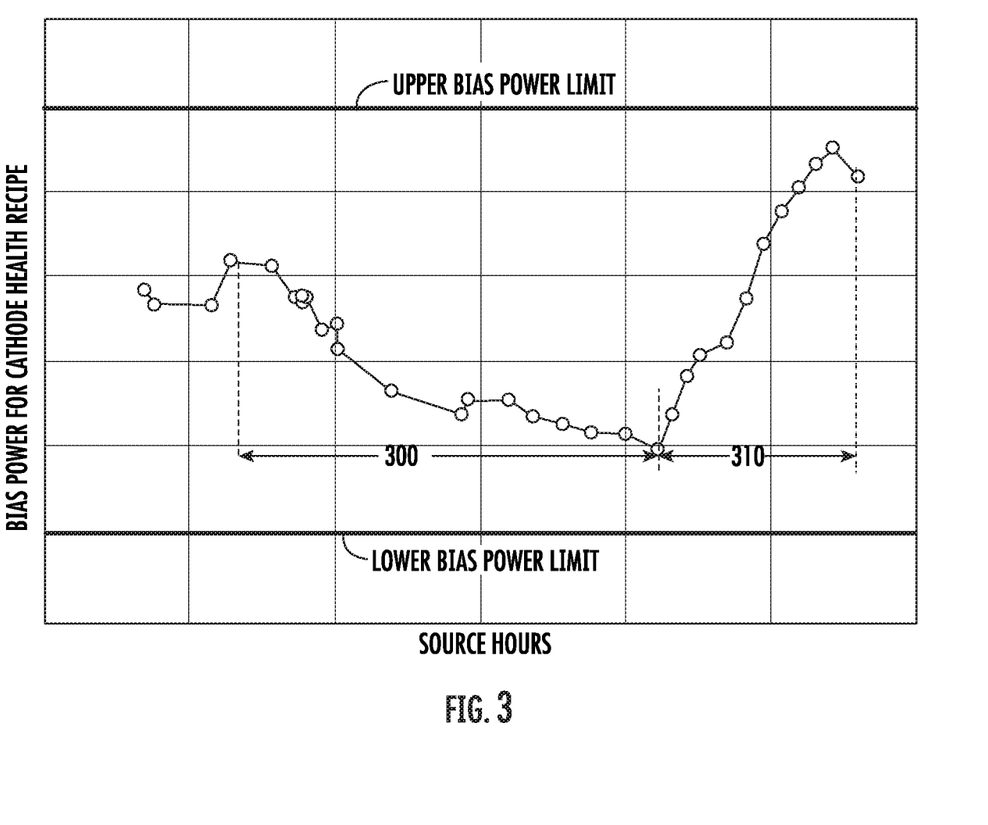
FIG. 3 illustrates the change in bias power as compared to hours of operation.

It was found that as the cathode 110 becomes thinner, the amount of bias power to achieve a desired extracted beam current is reduced. Bias power is defined as the voltage supplied by the cathode bias power supply 115, multiplied by the current supplied by that cathode bias power supply 115. Conversely, as the cathode 110 becomes thicker, the amount of bias power to achieve the desired extracted beam current increases. An example of this is shown in FIG. 3. The extracted current is kept constant during this time. Note that during the first time period 300, 67% of the operating time, the ion source was operated with high arc voltage recipes. This high arc voltage halogen-based recipe causes material to be removed from the cathode 110. Note that the bias power decreases during this time period as the cathode thins. During the second time period 310, only 42% of the operating time, the ion source was operating with a high arc voltage recipe, with the remainder of the operating time being low arc voltage recipes. Note that the bias power increases during this time period. This is due to the halogen cycle from the low arc voltage recipes, where tungsten from the walls is removed by the halogens in the plasma and redeposited on the cathode 110 and repeller 120, making those components thicker.

Figure 4:
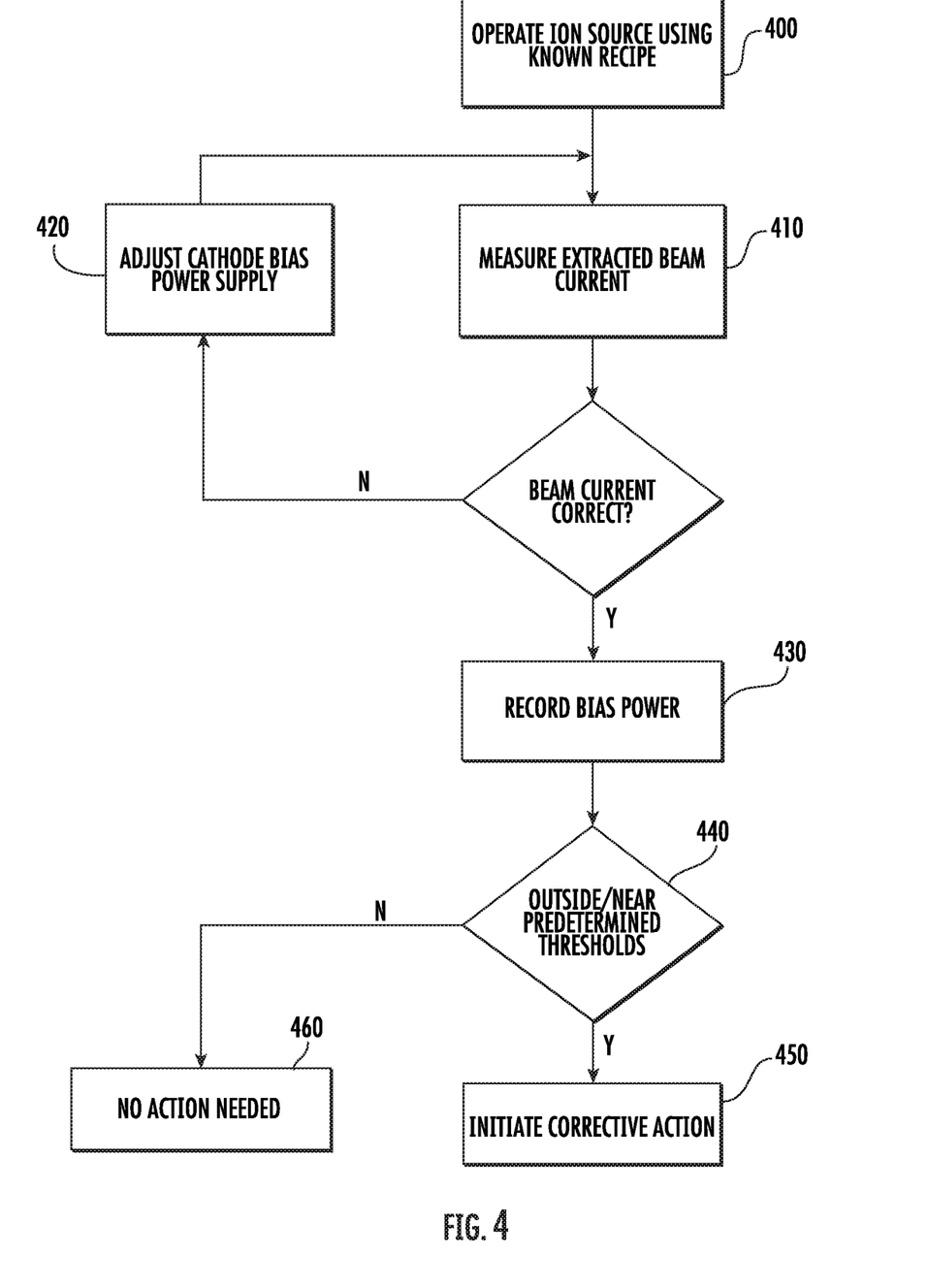
FIG. 4 is a flowchart showing a sequence to check the health of a cathode according to a first embodiment.

Thus, one way to determine the health of the cathode 110 may be by monitoring bias power, as shown in FIG. 4.

In this embodiment, as shown in Box 400, a known recipe is used in the IHC ion source 10. This known recipe may be a commonly used recipe, or may be a recipe that is used during idle times. This recipe may be a halogen-based recipe, or may be a recipe that does not include a halogen. This known recipe may also be referred to as the cathode health recipe. A recipe may include the species to be used, the flow rate of the species, the desired extraction voltage, the desired arc voltage, and other parameters.

Figure 5:
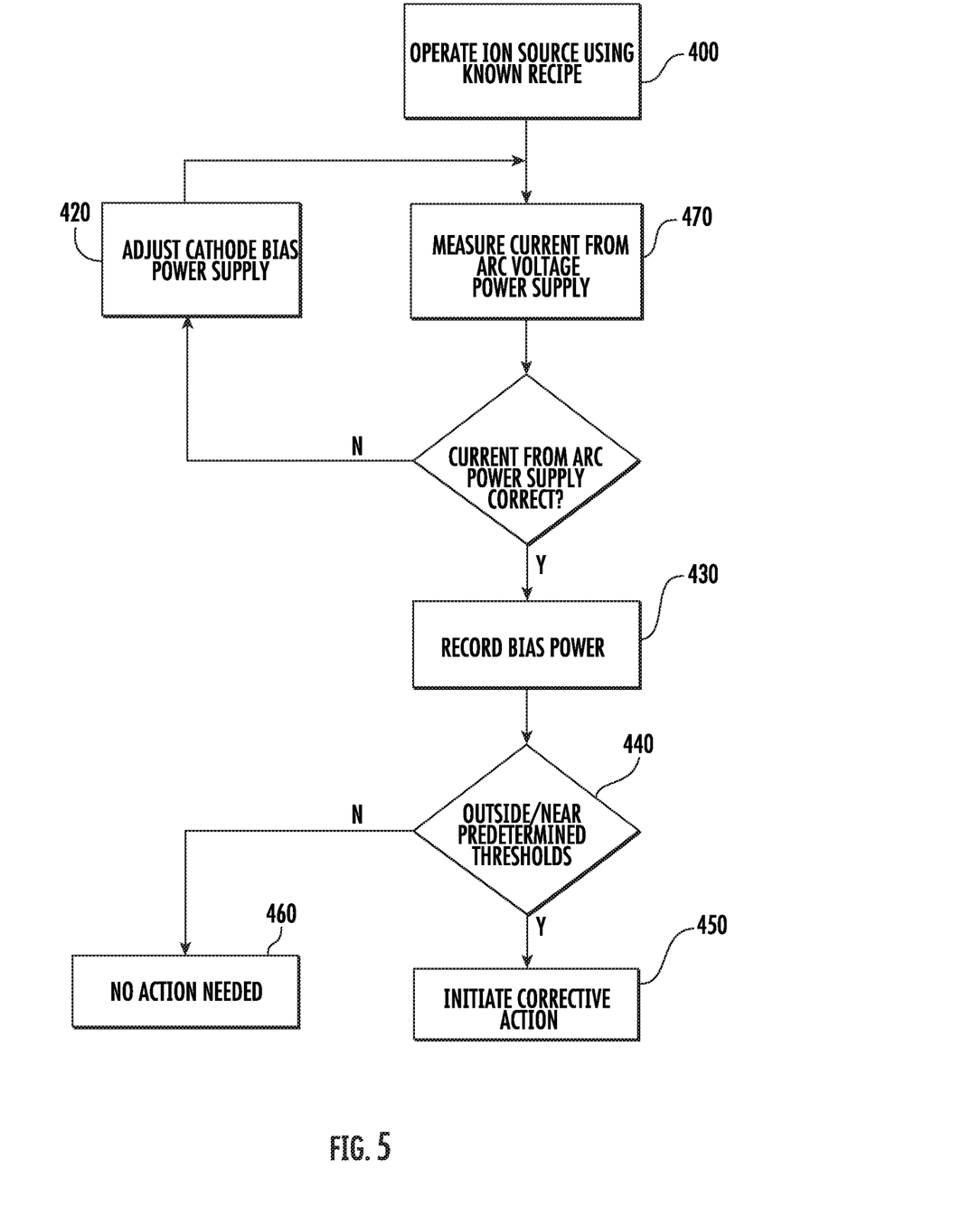
FIG. 5 is a flowchart showing a sequence to check the health of a cathode according to a second embodiment.

Then, as shown in Box 410, the controller 180 monitors the total extracted beam current, such as by use of the extraction power supply 170. As shown in Box 420, the controller 180 varies the bias power by modifying the output from the cathode bias power supply 115 so that the total extracted current maintains a predetermined value. The controller 180 then records the bias power that was used to create the predetermined extracted current, as shown in Box 430. Alternatively, one could also use the total arc or plasma current in source as a feedback for the bias current via the arc voltage power supply, or a power supply that biases the cathode with respect to chamber ground. This is shown in FIG. 5.

The controller 180 then compares this bias power to predetermined upper and lower thresholds, as shown in Box 440. These upper and lower thresholds may be calculated empirically or using another technique. For example, the lower threshold may be established by determining the bias power where punch-through occurs, and adding a safety margin to this value. The upper threshold may be established by determining the bias power at which it is no longer possible to regulate the extraction current, and subtracting a safety margin from that value. These upper and lower thresholds may be a function of the cathode health recipe.

Based on the result of this comparison, the controller 180 may initiate an action, as shown in Box 450. Specifically, if the bias power is near or less than the lower threshold, or is near or greater than the upper threshold, the action may be initiated. Alternatively, no action may be undertaken if the bias power is between the two thresholds, as shown in Box 460. The sequence shown in FIG. 4 may be repeated, such as at regular time intervals, including every 8 hours, or at specific recipe transitions. In this way, the health of the cathode 110 may be monitored over time. The ideal frequency of this monitoring will be a function of the recipe mix being utilized in the ion source.

Thus, the present disclosure presents a system and method of monitoring the status of the cathode 110 by tracking bias power while using a known recipe to deliver a predetermined extracted beam current. While the above disclosure describes the use of bias power to monitor cathode health, other parameters may also be used. For example, parameters such as bias voltage, bias current, bias impedance, which is defined as bias voltage divided by bias current, filament power, filament current, filament voltage, or filament resistance may be used to track cathode health.

A second way to determine the health of the cathode 110 may be by monitoring bias power while maintaining a constant current drawn from the arc voltage power supply 111, as shown in FIG. 5. In this embodiment, rather than attempting to maintain a constant extracted beam current, the current from the arc voltage power supply 111 is maintained at a constant value.

Thus, this sequence is very similar to that shown in FIG. 4. However, instead of monitoring extracted beam current, the controller 180 monitors the total current drawn by the arc voltage power supply 111, as shown in Box 470. The rest of the sequence is as described above.

Thus, in both embodiments, the controller adjusts a first parameter in order to maintain a second parameter at a predetermined value, wherein the value of the first parameter is indicative of the thickness of the cathode. While FIG. 4 and FIG. 5 show the first parameter as being bias power, it is not limited to this parameter. For example, as stated above, the first parameter may be bias current, bias voltage, bias impedance, filament power, filament current, filament voltage, or filament resistance. The second parameter may be the total extracted current or the current drawn from the arc voltage power supply.

This technique of monitoring the health of the cathode 110 may be used in a plurality of ways.

In one embodiment, the action initiated in Box 450 may be an alert to an operator, informing the operator that the cathode 110 is near failure and a corrective action is to be taken. For example, if the bias power is near the lower threshold, the corrective action may be to inform the operator to operate the ion source using a low arc voltage recipe. Conversely, if the bias power is near the upper threshold, the corrective action may be to operate using a high arc voltage recipe. Executing this corrective action for a period of time, such as one hour or more, such as between one hour and six hours, may serve to improve the health by either adding material to the cathode 110 or removing material from the cathode 110, so as to return the bias power back to an acceptable range. This approach allows the operator maximum flexibility in determining when to perform the corrective action.

In another embodiment, the action initiated in Box 450 may be to allow the controller 180 to perform the prescribed corrective action automatically. For example, if the monitored bias power approaches the lower threshold, the controller 180 may initiate a low arc voltage recipe to regrow the cathode 110. To achieve the fastest growth, this halogen-based low arc voltage recipe may be operated without dilution to maximize halogen growth of the cathode 110. Conversely, if the monitored bias power approaches the upper threshold, the controller 180 may initiate a high arc voltage recipe to thin the cathode 110. This corrective action may be started immediately, or the controller 180 may allow the operator the option to schedule the corrective action at a convenient time.

In a third embodiment, the action initiated in Box 450 may be an active adjustment of the halogen cycle by the controller 180. As noted above, dilution is often used to reduce the halogen cycle such that less material is removed from the walls and deposited on the cathode 110. In some embodiments, the dilution gas may be hydrogen or a gas that contains hydrogen, such as $PH_3$ or $NH_3$. In certain embodiments, hydrogen is added at a first flow rate, which may be, for example, roughly 0.5 sccm although other flow rates are possible. The introduction of hydrogen serves to reduce the halogen cycle for halogen-based low arc voltage recipes. Thus, in one embodiment, the controller 180 may monitor the thickness of the cathode 110, such as described in FIG. 4 or FIG. 5. The controller 180 then actively modulates the flow rate of the dilution gas in response. For example, as the cathode 110 nears or reaches its lower limit (in terms to thickness or bias power), the controller 180 may opt to reduce or disable the flow rate of the dilution gas for halogen-based low arc voltage recipes. This action will tend to grow material on the cathode 110. Conversely, if the cathode nears or reaches its upper limit (in terms of thickness or bias power), the controller 180 may opt to increase the flow rate of dilution gas to further slow the halogen cycle, thus preventing the bias power from continuing to increase. In certain embodiments, the flow rate of dilution gas is varied as a function of cathode thickness so that the cathode does not reach the upper or lower threshold. The flow rate of the dilution gas may be modified by the controller 180 by providing control signals from the controller 180 to the MFC associated with the dilution gas.

The present system and method have many advantages. Currently, when an IHC ion source is operated with high arc voltage recipes for an extended period of time, the thickness of the cathode is reduced. If left unchecked, the cathode will fail, necessitating a repair procedure. By monitoring the health of the cathode, proactive measures may be taken to extend the life of the cathode. Advantageously, the system and method described herein do not necessitate any modification to the hardware configuration. Rather, the enhancements may be implemented entirely in software, allowing this system and method to be retrofitted on existing systems. By monitoring the health of the cathode and adjusting the recipes used in the ion source, the life of the cathode may be more than doubled.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
   a chamber comprising a plurality of walls;
   a cathode disposed on one end of the chamber;
   a gas inlet to allow an introduction of one or more gasses into the chamber; and
   a controller, wherein the controller operates the ion source using a known recipe and adjusts a first parameter of the ion source to maintain a second parameter at a predetermined value, wherein a value of the first parameter is indicative of a thickness of the cathode; and
   wherein the controller initiates an action based on the thickness.

2. The ion source of claim 1, wherein the second parameter comprises a total extracted current from the chamber.

3. The ion source of claim 1, comprising an arc voltage power supply to bias the cathode relative to the chamber and wherein the second parameter comprises a current drawn from the arc voltage power supply.

4. The ion source of claim 1, wherein the first parameter comprises bias power.

5. The ion source of claim 1, wherein the first parameter is selected from the group consisting of bias current, bias voltage, bias impedance, filament power, filament current, filament voltage, and filament resistance.

6. The ion source of claim 1, wherein the action comprises an alert to an operator.

7. The ion source of claim 1, wherein the action comprises operating the ion source with a specific recipe.

8. The ion source of claim 7, wherein if the thickness of the cathode is determined to be less than a predetermined thickness, the specific recipe comprises a low arc voltage recipe.

9. The ion source of claim 7, wherein if the thickness of the cathode is determined to be more than a predetermined thickness, the specific recipe comprises a high arc voltage recipe.

10. The ion source of claim 1, wherein the action comprises adjusting a flow rate of dilution gas into the chamber.

11. The ion source of claim 10, wherein if the thickness of the cathode is determined to be less than a predetermined thickness, the flow rate of dilution gas is decreased.

12. The ion source of claim 10, wherein if the thickness of the cathode is determined to be more than a predetermined thickness, the flow rate of dilution gas is increased.

13. A method of monitoring and extending a life of a cathode in an indirectly heated cathode (IHC) ion source, comprising:
    operating the IHC ion source using a known recipe;
    monitoring a first parameter used to maintain a second parameter at a predetermined value, wherein a value of the first parameter is indicative of a thickness of the cathode;
    comparing the first parameter to predetermined upper and lower limits; and
    performing an action based on the comparison.

14. The method of claim 13, wherein the second parameter comprises a total extracted current from a chamber of the IHC ion source.

15. The method of claim 13, wherein the IHC ion source comprises an arc voltage power supply to bias the cathode relative to a chamber of the IHC ion source; and wherein the second parameter comprises a current drawn from the arc voltage power supply.

16. The method of claim 13, wherein the first parameter comprises bias power.

17. The method of claim 13, wherein the action comprises alerting an operator.

18. The method of claim 13, wherein the action comprises operating the IHC ion source with a specific recipe; and wherein if the thickness of the cathode is determined to be less than a predetermined thickness, the specific recipe comprises a low arc voltage recipe.

19. The method of claim 13, wherein the action comprises operating the IHC ion source with a specific recipe; and wherein if the thickness of the cathode is determined to be more than a predetermined thickness, the specific recipe comprises a high arc voltage recipe.

20. The method of claim 13, wherein the action comprises adjusting a flow rate of dilution gas into a chamber of the IHC ion source.

* * * * *